US 6,608,364 B2

(12) United States Patent
Carpentier

(10) Patent No.: US 6,608,364 B2
(45) Date of Patent: Aug. 19, 2003

(54) SEMICONDUCTOR DEVICE COMPRISING WINDINGS CONSTITUTING INDUCTORS

(75) Inventor: Jean-Francois Carpentier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/055,710

(22) Filed: Jan. 22, 2002

(65) Prior Publication Data

US 2002/0130387 A1 Sep. 19, 2002

(30) Foreign Application Priority Data

Jan. 22, 2001  (FR) .............................. 01 00818

(51) Int. Cl.$^7$ .............................. H01L 29/00
(52) U.S. Cl. .................. 257/531; 257/528; 336/223; 336/200
(58) Field of Search ................ 257/531, 528; 336/223, 182, 200

(56) References Cited

U.S. PATENT DOCUMENTS

| 4,816,784 | A | * | 3/1989 | Rabjohn | .................. | 333/24 R |
| 5,451,914 | A | * | 9/1995 | Stengel | ..................... | 333/25 |
| 5,610,433 | A | * | 3/1997 | Merrill et al. | ............. | 257/531 |
| 6,476,704 | B2 | * | 11/2002 | Goff | ............................ | 336/200 |

FOREIGN PATENT DOCUMENTS

| EP | 0324240 A2 | 7/1989 |
| WO | WO00/57437 | 9/2000 |

OTHER PUBLICATIONS

Engels, M., et al., "Modeling and Design of Novel Passive MMIC Components with Three and More Conductor Levels," pp. 1293–1296, No. XP000516779, 1994 IEEE MTT–S Digest, May 23, 1994.

Preliminary Search Report dated Oct. 15, 2001 for French Patent Application No. 0100818.

* cited by examiner

*Primary Examiner*—Hoai Ho
*Assistant Examiner*—Tu-Tu Ho
(74) *Attorney, Agent, or Firm*—Lisa K. Jorgenson; Jon A. Gibbons; Fleit, Kain, Gibbons, Gutman & Bongini P.L.

(57) ABSTRACT

Semiconductor device comprising a metal circuit with two parts wound into spirals which are formed such that the branches of one of the parts and the corresponding branches of the other part lie on either side of a median longitudinal region and are symmetrical with respect to this region. A common junction connects the inner ends of the parts and lies across the median longitudinal region and the intermediate junctions between the branches of one of the parts pass above or below the intermediate junctions between the branches of the other part. A common external connection is connected to the common junction and separate external connection are connected respectively to the outer ends of the wound parts. The wound parts constitute two symmetrical metal windings formed between the common connection and the separate connection, respectively, and constituting symmetrical inductors.

19 Claims, 4 Drawing Sheets

SEMICONDUCTOR DEVICE COMPRISING WINDINGS CONSTITUTING INDUCTORS

CROSS REFERENCE TO RELATED APPLICATIONS

This application is based upon and claims priority from prior French Patent Application No. 01-00818, filed Jan. 22, 2001, the disclosure of which is hereby incorporated by reference in its entirety.

BACKGROUND OF THE INVENTION

1. Field of the Invention

The present invention generally relates to semiconductor devices and more particularly to integrated circuits, in which windings constituting inductors, in particular magnetically-coupled inductors, are made so as to constitute a transformer.

2. Description of Related Art

The production of a transformer comprising a spiral primary metal winding and a spiral secondary metal winding made in the same layer with the turns of the winding wound in parallel is known in the art. The production of a transformer with different outputs in two spiral secondary metal windings formed in the same layer with the inner ends of these two windings being connected by vertical vias, is also known in the art. Such a topography is known by the name "balun." Such transformers are described in document 1998 IEEE, page 105.

Although the production of the transformer is useful, it is not without its shortcomings. One shortcoming is there is no way to supply two signals of equal amplitude. Another shortcoming is there is no way to supply two signals of equal magnitude but with a phase of 180°. Accordingly, there is a need to overcome these shortcomings and to provide a transformer that supplies two signals of equal magnitude but with a phase of 180°.

SUMMARY OF THE INVENTION

The present invention provides a semiconductor device with an integrated circuit formed over several levels and made in several layers. The integrated circuit includes a metal circuit capable of constituting two secondary inductors and a primary inductor, the geometry of which makes it possible, when it is magnetically coupled to this primary inductor, to supply two signals of equal amplitude but with a phase difference of 180°.

According to the invention, the device comprises a metal circuit comprising two parts wound into a spiral which have inner ends and outer ends between which they comprise branches which lie on either side of a median longitudinal region and the successive branches of which are connected by intermediate junctions crossing this median longitudinal region.

According to the invention, the parts wound into spirals are formed such that the branches of one of the parts and the corresponding branches of the other part, lying on either side of the median longitudinal region, are made in the same level and are symmetrical with respect to this median longitudinal region, that a common junction connects the inner ends of the parts and lies across the median longitudinal region, and that the intermediate junctions between the branches of one of the parts passes above or below the intermediate junctions between the branches of the other part.

According to the invention, the device comprises a common external connection means connected to the common junction and separate external connection means connected respectively to the outer ends.

Thus, the wound parts of the metal circuit constitute two secondary metal windings which are symmetrical and formed between the common connection means and the separate connection means, respectively, and constituting symmetrical inductors.

According to the invention, the primary winding comprises two parts wound into spirals which have inner ends and outer ends between which they comprise branches which lie on either side of a median longitudinal region and the successive branches of which are connected by intermediate junctions crossing this median longitudinal region.

According to the invention, the parts wound into a spiral are formed such that the branches of one of the parts and the corresponding branches of the other part, lying on either side of the median longitudinal region, are made in the same level and are symmetrical with respect to this median longitudinal region, that a common junction connects the inner ends of the parts and lies across the median longitudinal region, and that the intermediate junctions between the branches of one of the parts passes above or below the intermediate junctions between the branches of the other part.

According to the invention, the primary circuit comprises separate external connection means connected respectively to the outer ends.

According to the invention, the branches of the wound parts are U-shaped.

According to the invention, the outer ends of the wound parts are placed adjacently.

According to the invention, the intermediate junctions which cross are preferably such that one is in the level of the corresponding wound part and that the other consists of a bridge having a branch in another level and vias for connecting to the branches of the corresponding wound part.

According to the invention, the separate connection means are preferably symmetrical with respect to the median longitudinal region and the common connection means lies along this median longitudinal region.

According to the invention, the connection means preferably comprise branches which lie parallel to the median longitudinal region, the separate connection branches of the parts being made at the same level as these parts and the common connection branch being made at a level other than these parts and than the intermediate junctions and being connected to the common junction by vias.

According to the invention, the device preferably comprises an electrostatic screen which lies below the metal circuit.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
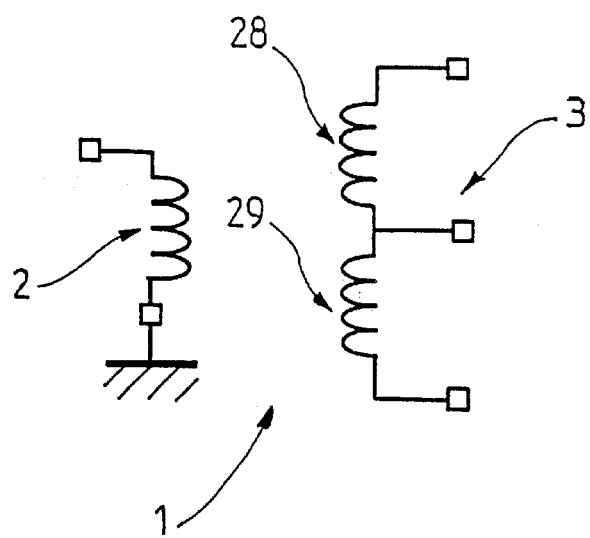
FIG. 1 shows a circuit diagram of an electrical transformer comprising a primary circuit and a secondary circuit which are superimposed.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements maybe in the plural and vice versa with no loss of generality.

In the drawing like numerals refer to like parts through several views.

With reference to FIG. 1, a transformer 1 which comprises a primary metal circuit 2 having a winding magnetically coupled to a secondary metal circuit 3 with two windings constructed in order to supply two signals of equal amplitude but with a phase difference of 180° between a common output and two other separate outputs, can be seen.

Figure 2:
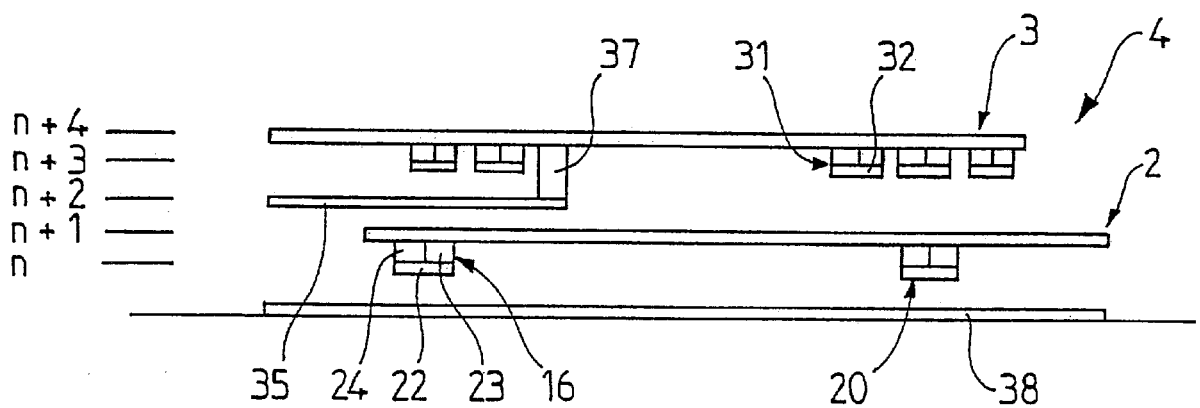
FIG. 2 shows a lateral schematic view of a semiconductor device including the transformer of FIG. 1.

With reference to FIG. 2, a semiconductor device 4 in which the primary circuit and the secondary circuit are integrated in a superimposed manner in order to constitute the transformer 1, these circuits being made by metal micro strips, can be seen.

This semiconductor device has five metallization layers formed at successive levels n, n+1, n+2, n+3, n+4. As will now be described, the primary circuit 2 is made in the layers n and n+1 and the secondary circuit 3 is made in the layers n+2, n+3 and n+4.

Figure 3:
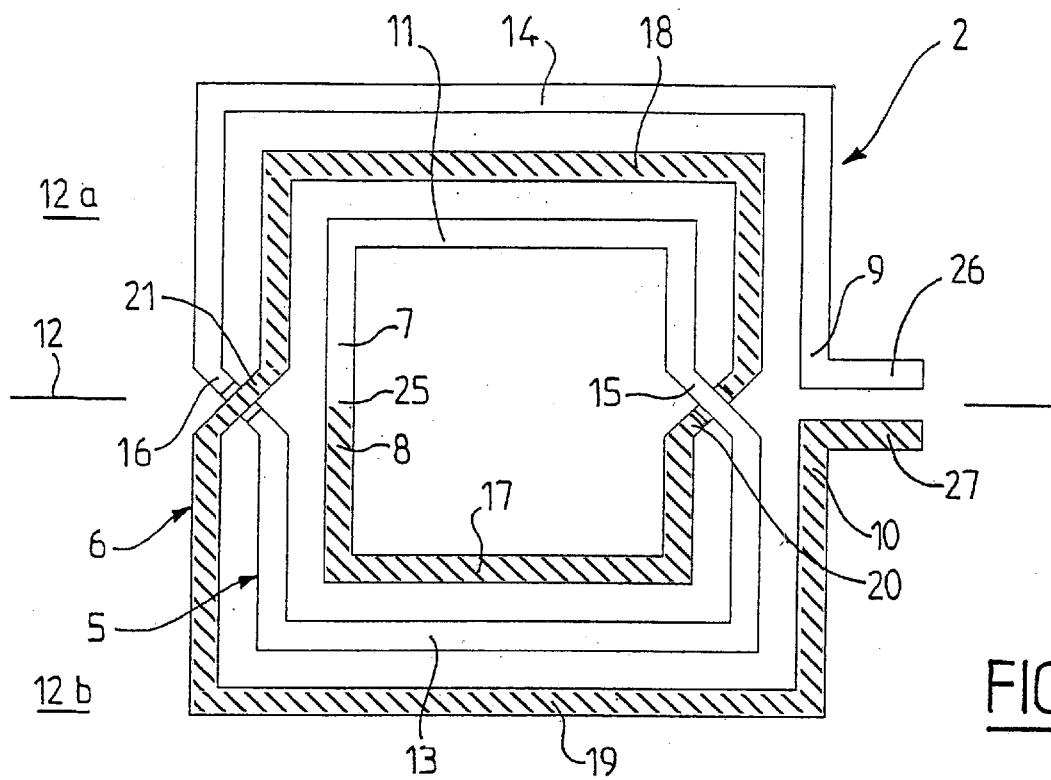
FIG. 3 shows atop view of the primary circuit included in the semiconductor device of FIG. 2.

With reference in particular to FIGS. 2 and 3, it can be seen that the primary circuit 2 comprises two metal parts 5 and 6 wound into spirals which have inner ends 7 and 8 and outer ends 9 and 10, each part 5 and 6 comprising one and a half turns produced and arranged as follows.

The wound part 5 has, from its inner end 7 and in the layer of level n+1, a U-shaped branch 11 which is located on a first side 12a of a median longitudinal region lying along a longitudinal axis 12, a U-shaped branch 13 which lies on the second side 12b of the median longitudinal region 12 and a U-shaped branch 14 which lies on the first side 12a of the median longitudinal region 12, the branches above being open on the side of the median region 12.

As will be described more specifically below, the branches 11 and 13 of the wound part 5 are connected by an intermediate junction 15 which crosses the median longitudinal region 12 and which lies at 45° and the branches 13 and 14 are connected by a junction 16 which crosses the median longitudinal region 12 and which lies at 45°.

Similarly, the wound part 6 comprises, from its inner end 8 and in the layer of level n+1, a U-shaped branch 17 located on the second side of the median longitudinal region 12, a U-shaped branch 18 located on the first side of the median longitudinal region 12 and a third U-shaped branch 19 located on the second side of the median longitudinal region 12.

The branches 17 and 18 of the wound part 6 are connected by an intermediate junction 20 which lies across the median longitudinal region 12, at 45° and the branches 18 and 19 are connected by an intermediate junction 21 which crosses the median longitudinal region 12, at 45°.

The branches of the wound part 5 and the corresponding branches of the wound part 6 are arranged symmetrically with respect to the median longitudinal region 12. Thus, the branches 11 and 17, the branches 13 and 18 and the branches 14 and 19 lie symmetrical with respect to the median longitudinal region 12 and the intermediate junctions 15 and 20 cross at 90° and the intermediate junctions 16 and 21 cross at 90°.

The branch 13 of the wound part 5 lies between the branches 17 and 19 of the wound part 6 and the branch 18 of the wound part 6 lies between the branches 11 and 14 of the wound part 5.

Like the aforementioned branches, the junction 15 of the wound part 5 and the junction 21 of the wound part 6 lie in the layer of level n+1.

Figure 5:
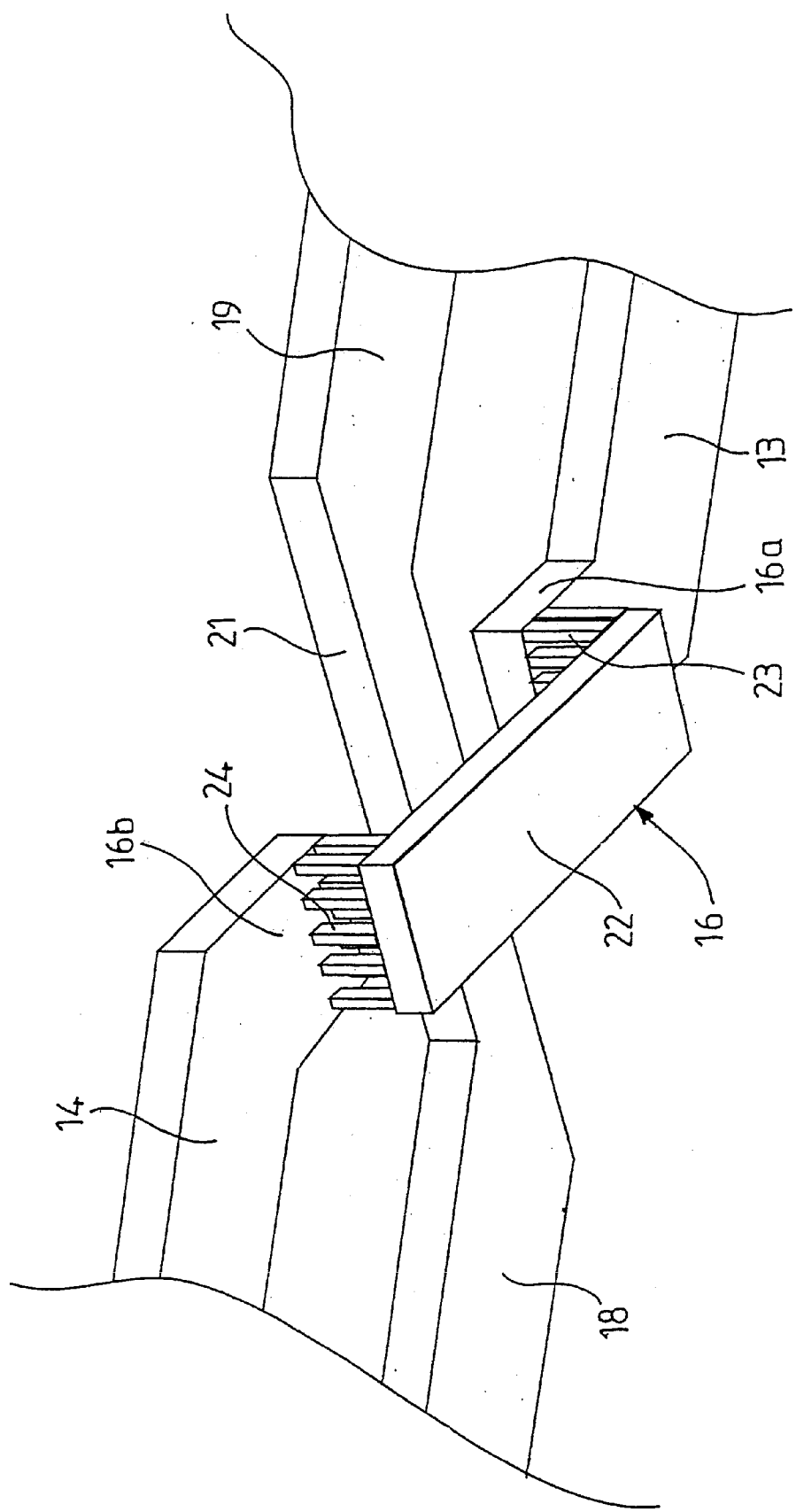
FIG. 5 shows a perspective view of a junction included in the aforementioned circuits.
Figure 6:
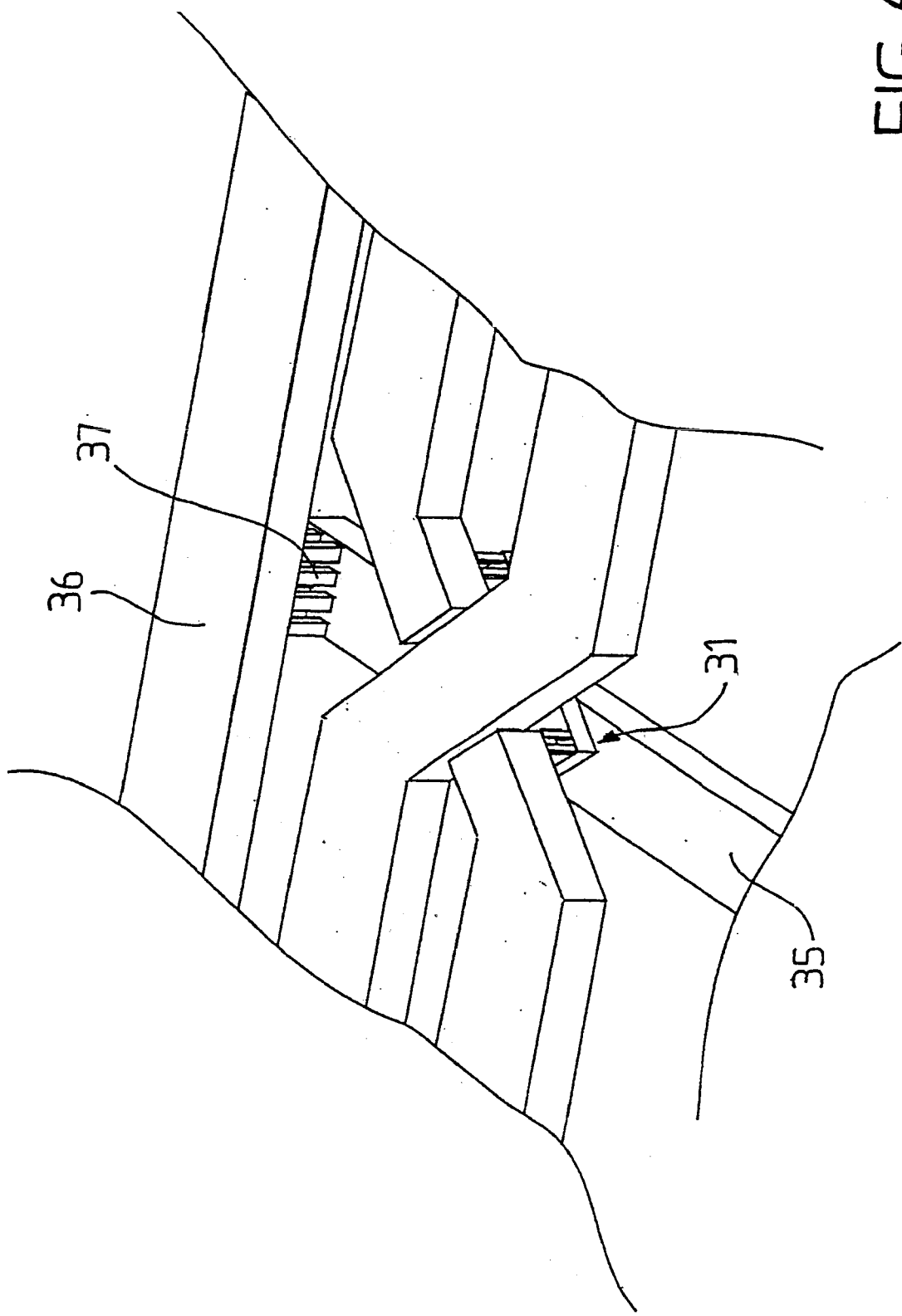
FIG. 6 shows a junction included in the aforementioned secondary circuit.

As is shown most particularly in FIG. 5, the intermediate junction 16 crosses the intermediate junction 21 by forming a bridge which bypasses this intermediate junction 21.

For this, the intermediate junction 16 comprises portions 16a and 16b which extend the branches 13 and 14 into the layer of level n+1 and which are interrupted at some distance from the intermediate junction 21, an intermediate branch 22 made in the layer of level n and vertical vias 23 and 24 which join the ends of portions 16a and 16b and the ends of the intermediate branch 22.

The intermediate junctions 15 and 20 are arranged so as to correspond to the intermediate junctions 16 and 21. This time, it is junction 20 which is made in the form of a bridge.

The inner ends 7 and 8 of the wound parts 5 and 6 are extended and connected directly by an inner junction 25 which crosses the median longitudinal region 12, perpendicularly, in the layer of level n+1.

The outer ends 9 and 10 of the wound parts 5 and 6 are arranged adjacently near the median longitudinal region 12 and are extended by separate external connection branches 26 and 27 which lie parallel to the median longitudinal region 12 and outward. These branches 26 and 27 are designed to be connected to a source of electrical energy from another component of the semiconductor device 4.

Thus, the primary circuit 2 consists of a metal winding which is symmetrical with respect to the median longitudinal region 12.

Figure 4:
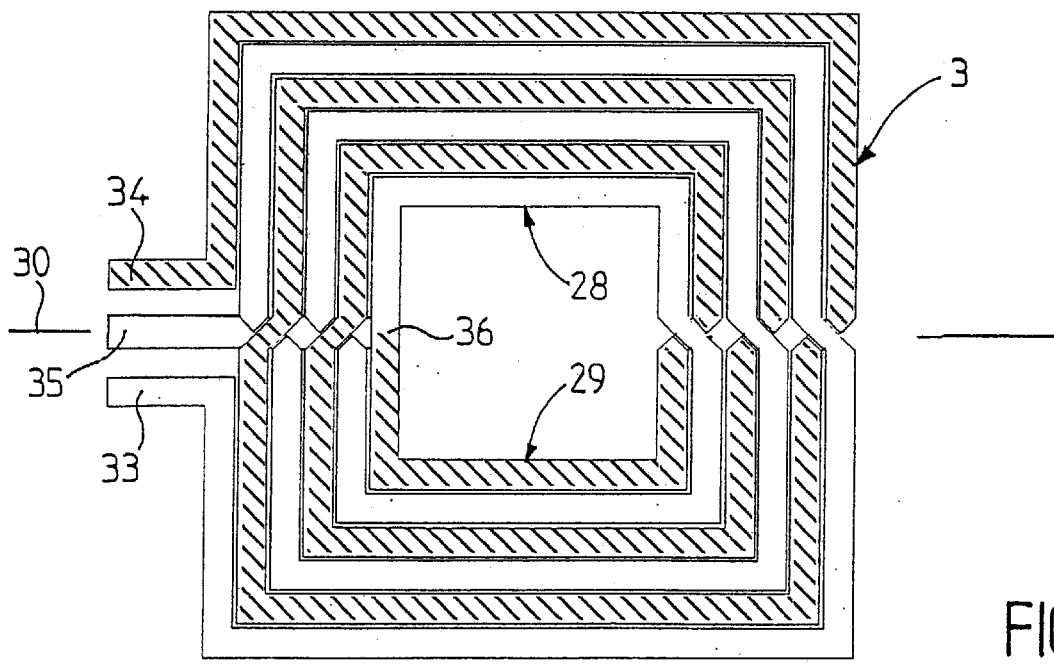
FIG. 4 shows a top view of the secondary circuit included in the semiconductor device of FIG. 2.

With reference in particular to FIGS. 2 and 4, it can be seen that the secondary metal circuit 3 also comprises two parts 28 and 29 wound into spirals which are constructed in the same way as the primary circuit 2.

However, this time, the wound parts 28 and 29 comprise respectively three turns and are formed symmetrically with respect to a median longitudinal region identified by its longitudinal axis 30.

The U-shaped branches of the wound parts 28 and 29 lie in the layer of level n+4 and the intermediate junctions which cross are made in the same way as the intermediate junctions which cross in the primary circuit 2. Thus they have bridges 31 which have intermediate branches 32 which lie in the layer of level n+3.

The outer ends of the wound parts 28 and 29 are also extended by separate longitudinal connection branches 33 and 34, which lie in the opposite direction to the connection branches 26 and 27 of the primary circuit 2.

Furthermore, the secondary circuit 3 comprises a common longitudinal connection branch 35 which lies parallel to the median longitudinal region 30 and which is made in the layer of level n+2. This external connection branch 35 is connected to the inner junction 36 for linking the ends of the wound parts 28 and 29 by vertical vias 37.

Thus, the secondary circuit 3 comprises wound parts 28 and 29 constituting two identical secondary windings formed respectively between, on the one hand, the common external connection branch 35 and the separate external connection branches 33 and 34.

The vias 37 are located at the geometric center of the secondary windings, they correspond by construction to the electrical center of the metal circuit 3.

The result of the structure described above is that the primary circuit 2 constitutes a primary inductor and that the secondary circuit 3 constitutes two secondary inductors, magnetically coupled to the primary circuit 2 constituting a primary inductor, such that the signals provided, on the one hand, between the external connection branches 33 and 35 and, on the other hand, between the external connection branches 34 and 35 are of equal amplitudes with a phase difference of 180°, these signals being delivered to other components of the semiconductor device 4.

Since the primary circuit 2 and the secondary circuit 3 are made in different levels, this structure has the advantage of being able to define or choose, independently, the number of turns forming them so as to obtain the desired transformer ratio, this for a required orientation of the external connection branches, for example 180 degrees as shown in FIGS. 3 and 4, while having the advantage of leading to the production of a transformer of small size.

In addition, this structure makes it possible to control the geometric position of the outer ends so as to limit the length of the connections with other circuits of the required function and to facilitate the microwave characterization of the device.

Furthermore, this structure has the advantage of being able to be determined, before fabrication, using electromagnetic simulation tools so as to obtain the desired transformer ratio.

Moreover, in order to isolate the transformer 1 with respect to the substrate of the semiconductor device 4 and to benefit from stray capacitances with respect to the substrate when using methods of matching by external capacitors, it is desirable to have available, below the layer of level n, an electrostatic screen 38.

It is important to note that the number of secondary windings can be increased from two to N, where the number of common junctions would also increase to N−1 and this is in the true scope and spirit of the present invention.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A semiconductor device with an integrated circuit made in several layers, the integrated circuit comprising:
   a metal circuit with two or more secondary metal windings formed from
      two parts wound into spirals which have inner ends and outer ends connected by one or more branches which lie on either side of a median longitudinal region; and
      one or more successive branches which are connected by intermediate junctions crossing the median longitudinal region;
   wherein the two parts wound into spirals are formed in a same layer such that the branches of one of the two parts and the branches of the second of the two parts lie on either side of the median longitudinal region and the two parts are symmetrical with respect to the median longitudinal region;
   a common junction connecting the inner ends of the two parts and lying across median longitudinal region, the common junction formed so that the intermediate junctions between the branches of one of the two parts passes above or below the intermediate junctions between the branches of the second of two parts;
   at least one common external connection means connected to the common junction; two or more separate external connection means connected to the outer ends; and
   a primary metal winding coupled to the metal circuit;
   wherein the secondary metal windings are symmetrical and electrically formed between the common external connection means and the separate external connection means, respectively, and constitute symmetrical inductors;
   wherein the primary metal winding is formed in at least one layer different from the layer with the two secondary metal windings.

2. The semiconductor device according to claim 1, wherein the primary winding further comprises:
   two parts wound into spirals which have inner ends and outer ends between so as to form two or more branches which lie on either side of a median longitudinal region wherein each of the two or more branches are connected by intermediate junctions crossing the median longitudinal region;
   a common junction which connects the inner ends of the two parts of the primary winding and lies across the median longitudinal region, and that the intermediate junctions between the branches of one of the parts passes above or below the intermediate junctions between the branches of the second of two parts; and
   one or more separate external connection means connected respectively to the outer ends;
   wherein the two parts of the primary winding are formed such that the branches of first of the two parts and the branches of the second of two parts lie on either side of the median longitudinal region so as to be symmetrical with respect to the median longitudinal region.

3. The semiconductor device according to claim 1, wherein the two parts wound in spirals which form secondary metal windings which are U-shaped.

4. The semiconductor device according to claim 2, wherein the two parts wound in spirals which form secondary metal windings which are U-shaped.

5. The semiconductor device according to claim 2, wherein the two parts of the primary winding are U-shaped.

6. The semiconductor device according to claim 2, wherein the outer ends of the primary winding are placed adjacently.

7. The semiconductor device according to claim 1, wherein the intermediate junctions of the secondary metal windings cross such that one is formed in the layer of the one or the two wound parts and second of the two wound parts includes a bridge having a branch in another layer and vias for connecting to the branches of the second of the two wound parts.

8. The semiconductor device according to claim 1, wherein the intermediate junctions of the secondary metal winding cross at a substantially 90 degree angle.

9. The semiconductor device according to claim 2, wherein the intermediate junctions of the primary metal winding cross such that one is formed in the layer of the one or the two wound parts and second of the two wound parts includes a bridge having a branch in another layer and vias for connecting to the branches of the second of the two wound parts.

10. The semiconductor device according to claim 2, wherein the intermediate junctions of the primary metal winding cross at a substantially 90 degree angle.

11. The semiconductor device according to claim 1, wherein the separate connection means are symmetrical with respect to the median longitudinal region and the common external connection means lies along the median longitudinal region.

12. The semiconductor device according to claim 2, wherein the separate connection means are symmetrical with respect to the median longitudinal region and the common external connection means lies along the median longitudinal region.

13. The semiconductor device according to claim 1, wherein the connection means comprise separate connection branches which lie parallel to the median longitudinal region, so that the separate connection branches are formed at the same layer as the two or more secondary metal windings and wherein the common junction is formed at a layer other than two or more secondary metal windings and at a layer different than the intermediate junctions and the separated connection branches are connected to the common junction by vias.

14. The semiconductor device according to claim 12, wherein the connection means comprise separate connection branches which lie parallel to the median longitudinal region, so that the separate connection branches are formed at the same layer as the two or more secondary metal windings and wherein the common junction is formed at a layer other than two or more secondary metal windings and at a layer different than the intermediate junctions and the separated connection branches are connected to the common junction by vias.

15. The semiconductor device according to claim 1, further comprising:

an electrostatic screen which lies below the metal circuit.

16. An integrated circuit made in several layers comprising:

a primary metal winding coupled to a metal circuit;

two or more secondary metal windings coupled to the metal circuit wherein each secondary metal windings is formed in a layer from two parts so that each part is wound into spirals which have inner ends and outer ends connected by one or more branches which lie on either side of a median longitudinal region; and one or more common junctions which connects the inner ends of each of the two parts and lies across the median longitudinal region, and that the intermediate junctions between the branches of one of the parts passes above or below the intermediate junctions between the branches of the second of two parts using vias between two or more layers so as to provide a metal circuit that produces two or more signals of substantially equal magnitude from a single signal applied to the primary metal winding whereby at least two of the two or more signals have a phase difference of approximately 180 degrees.

17. The semiconductor device according to claim 16 further comprising:

an electrostatic screen which lies below the metal circuit.

18. The semiconductor device according to claim 16, wherein the intermediate junctions of the secondary metal winding cross at a substantially 90 degree angle.

19. The semiconductor device according to claim 18, wherein the two parts wound in spirals form two or more secondary metal windings which are U-shaped.

* * * * *